Figure 1:
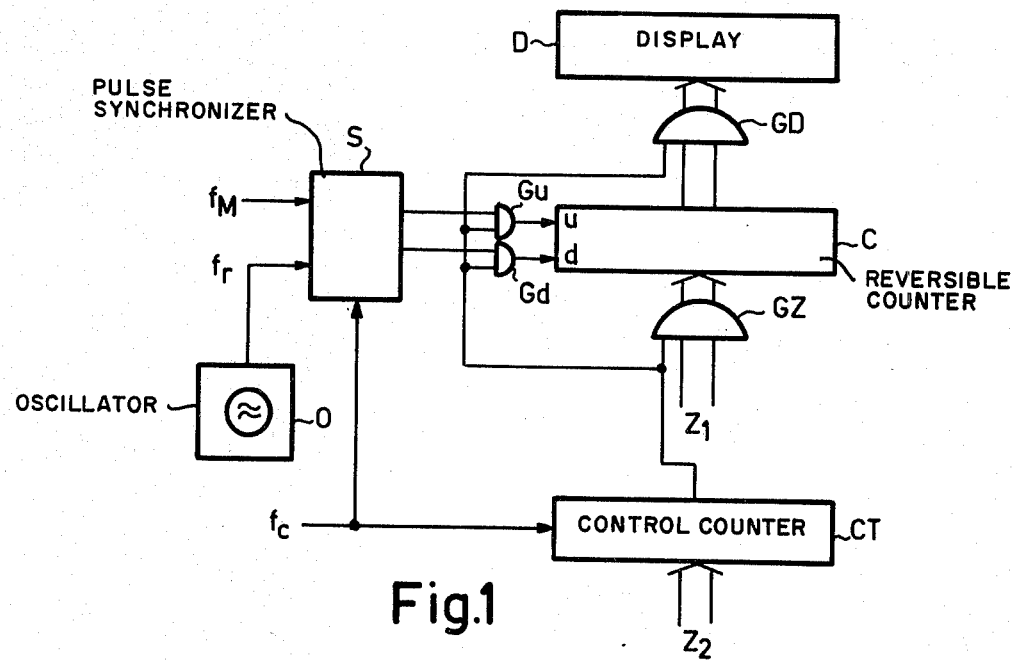

United States Patent [19]

Schroder

[11] 4,004,137
[45] Jan. 18, 1977

[54] READOUT APPARATUS FOR FREQUENCY OR PERIOD-ANALOG MEASURING SIGNALS

[75] Inventor: Gerd Schroder, Hamburg, Germany

[73] Assignee: U.S. Philips Corporation, New York, N.Y.

[22] Filed: Dec. 31, 1974

[21] Appl. No.: 537,690

[30] Foreign Application Priority Data

Jan. 4, 1974 Germany .................. 2400285

[52] U.S. Cl. .................. 235/92 TF; 235/92 FQ; 235/92 MT; 324/78 D; 324/79 D
[51] Int. Cl.² .................. G06M 3/00
[58] Field of Search ..... 73/1 F; 235/92 TF, 92 MT, 235/92 FQ, 92 CC; 324/78 D, 79 D

[56] References Cited

UNITED STATES PATENTS

| | | | |
|---|---|---|---|
| 3,617,713 | 11/1971 | Karlsson | 235/92 MT |
| 3,766,535 | 10/1973 | Deebel et al. | 235/92 FQ |

Primary Examiner—Thomas J. Sloyan
Attorney, Agent, or Firm—Frank R. Trifari; Bernard Franzblau

[57] ABSTRACT

In the case of frequency-analog measuring values the readout apparatus must be calibrated with respect to two reference points. The readout apparatus comprises a reversible counter, whose counting input for the one counting direction receives the measuring pulse train during a first time interval and whose counting input for the other counting direction receives a reference pulse train during a second time interval. The reference frequency is equalized to the measuring frequency for one reference point and the counter is set to said initial value at the beginning. The time intervals, which are equal and which coincide, are adjusted so with respect to a second reference point, that the counter indicates the desired value. The time intervals are determined in a control counter by a clock frequency. However, for period-analog measuring signals the reversible counter counts the clock frequency, and the measuring frequency and the reference frequency are applied to the control counter.

13 Claims, 6 Drawing Figures

READOUT APPARATUS FOR FREQUENCY OR PERIOD-ANALOG MEASURING SIGNALS

The invention relates to an apparatus for the digital readout of a physical measuring quantity by means of a counter, which quantity is represented by the frequency or period of a measuring pulse train, the count of said counter at the end of a measuring period providing a direct readout of the value of the measuring quantity.

The transmission of measuring values in the form of electrical signals over long distances often gives rise to problems; because disturbing signals affect the electrical signal and thus the measuring value which it represents. Said problems are minimal when the measuring quantity is represented by a frequency-analog or period-analog signal, i.e. when the measured physical quantity is converted into a pulse signal or a.c. signal whose frequency or period represents the value of the measured variable. Thus, a reliable transmission of measuring values is possible; because in the case of the frequency or period of alternating signals, a substantially more severe disturbance is permissible than is the case of direct voltages or direct currents.

Said method has a further major advantage. At the receiving end the transmitted measuring values must either be displayed or applied to an on-line computer which is generally of the digital type. In the case of frequency or period-analog signals this can be accomplished very easily by the use of digital counters.

However, this gives rise to certain problems, especially since the measuring transducers are subject to certain manufacturing tolerances, so that the initial value as well as the proportionality of the measuring pulse train and the measuring value represented thereby may vary or is not exactly known. Only the exact proportionality of the measured value and the measuring pulse train may be presupposed. Furthermore, in the case of the frequency-analog or period-analog representation of measuring values, the zero point of the measuring value is represented by a finite value of the frequency or period of the measuring pulse train. For display or application to an on-line computer, i.e. for readout in general, said offset value must be suppressed automatically, if possible. The readout apparatus with the measuring transducer which is connected thereto should therefore be calibrated at two reference points, by adjusting it so that, when possible, it provides a direct readout of the corresponding values for two given known magnitudes of the measuring quantity.

Various counters are known which, starting from a certain preset initial count, count the pulses of an applied pulse signal within an adjustable counting interval. An example of such a counter is the Hewlett Packard hp5330. However, said counters are not particularly suited for the readout of frequency-analog or period-analog measured-value signals because their adjustment to the two given reference points is difficult as the adjustments of the two reference points interact, so that only an iterative adjustment is possible.

It is an object of the invention to provide a readout apparatus with a counter for frequency-analog or period-analog measuring values, which can be adjusted simply and reliably for two given reference points. According to the ivention this is achieved in that the counter is a reversible counter which is preset to a count which represents a first given measuring value. In the case of frequency-analog measuring values the counter receives the measuring pulse train at the counting input for the one counting direction during a first time interval of adjustable length and receives a reference pulse train at the counting input for the opposite counting direction during a second time interval of the same length. Furthermore, the frequency of the reference pulse train is equalized to that of the measuring pulse train which represents the first given measuring value and the length of the time intervals is adjusted so that upon application of a measuring pulse train which represents another given measuring value, the contents of the counter at the end of the measuring period, which terminates together with the last time interval, represents the other measuring value. Thus, the adjustments of the device for the two reference points are fully independent of one another because at the first reference point the reference frequency is adjusted, which is independent of the length of the time interval, whereas for the second reference point the time interval is directly adjusted to a length at which the frequency of the reference pulse train is the same.

The two time intervals may also coincide, the counter simultaneously receiving the respective pulse trains at the two counting inputs and thus counting the difference between them. In order to prevent an incorrect count in the case of simultaneously arriving pulses at the two counting inputs, it is effective to synchronize the two pulse trains by means of a synchonizing stage. This synchronizing stage may then also form the difference between the two pulse trains, so that the counter only receives the difference pulses at the counting input which corresponds to the sign of the difference.

The time intervals can simply be obtained by means of a control counter in that the control counter counts a specific number of clock pulses of a clock pulse train. The length of the time intervals or the time interval respectively can readily be varied by varying said number in that the counter is set to the count which corresponds to said number and counts down from that count to zero.

For period-analog measuring signals the above-mentioned problem is solved, according to the invention, in that the counter is a reversible counter which is preset to a count which represents a first given measuring value and which in the case of period analog measuring values receives a clock pulse train of fixed frequency at the counting input for the one counting direction during a first time interval whose length is determined by an adjustable number of measuring pulses and which receives the clock pulse train at the counting input for the opposite counting direction during a second time interval whose length is determined by an equal number of reference pulses. The frequency of the reference pulse train is equalized to that of the measuring pulse train which represents the first given measuring value and the number which determines the length of the time intervals is adjusted so that upon application of a measuring pulse train which represents another given measuring value, the contents of the counter, at the end of the measuring period which terminates together with the last time interval, represents the other measuring value. Thus, exactly the same arrangement is employed as for the readout of frequency-analog measuring values with the same operational sequence, except that the assignment of the signals and thus the dimensioning of the time intervals is to be changed as described.

From an embodiment to be described hereinafter it is evident that this can be achieved practically by merely interchanging the signal leads.

Again, the time intervals can be obtained with the aid of a control counter which counts an adjustable number of pulses, but in the present case first the measuring pulses and then the reference pulses. As depending on the measuring range the count at the end of the first time interval substantially exceeds the count attained at the end of the measuring period, only the lower counting stages of the counter need be connected to the display device or to the computer in accordance with the maximum measuring value.

When period-analog measuring signals are read out, the two time intervals may also begin simultaneously. However, as they have different lengths except for the first given measuring value, the counter counting the same clock pulse train for both time intervals, the counter now must count only during the time in which the one time interval has already expired, but the other interval has not yet terminated. The counting direction depends on which time interval terminates first. This can be realized effectively by means of two control counters which simultaneously start to count the respective pulse trains.

Both in the apparatus for the readout of frequency-analog measuring signals and in that for the readout of period-analog measuring signals, the counting direction of the counter can readily be reversed by including a switching device before the two inputs for the two counting directions, which device interchanges the counting signals. When said change is controlled by the zero passage of the counter, operation of the counter in the negative range is possible.

Figure 3:
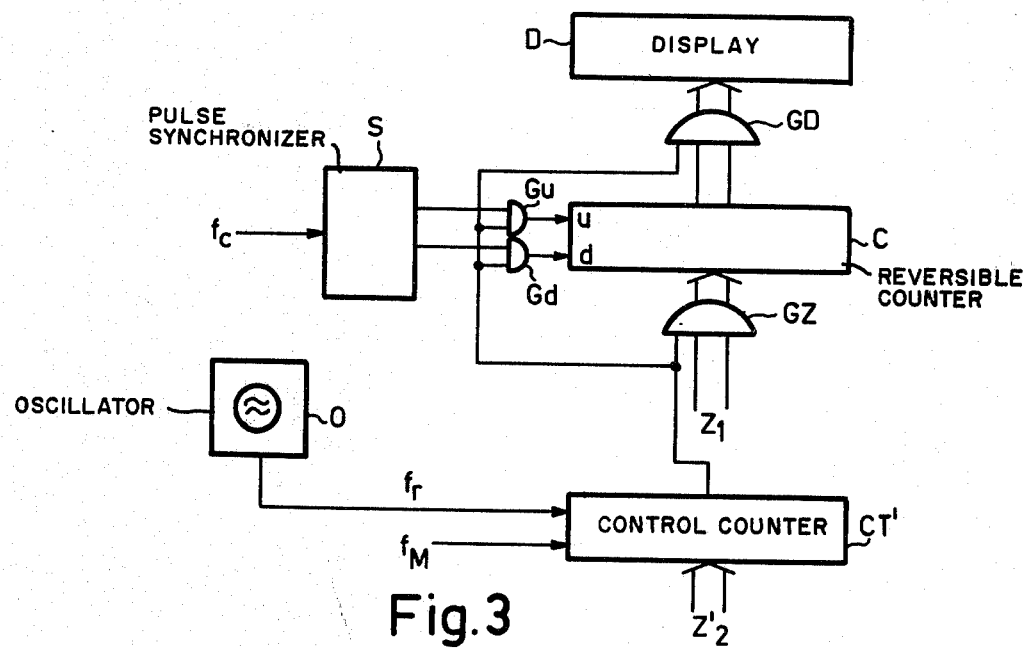
Figure 2:
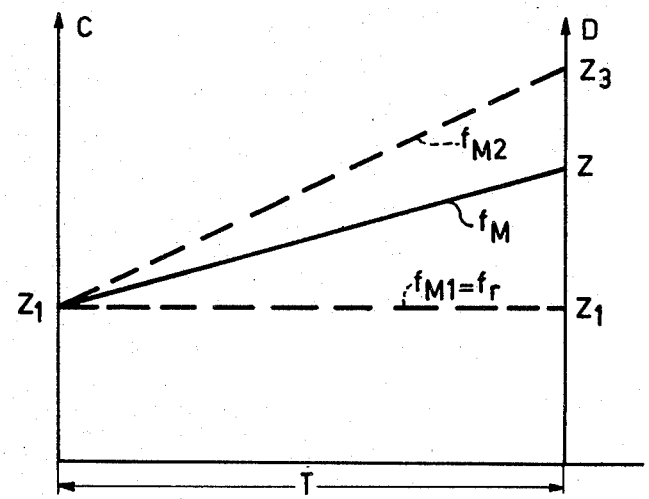
Figure 4:
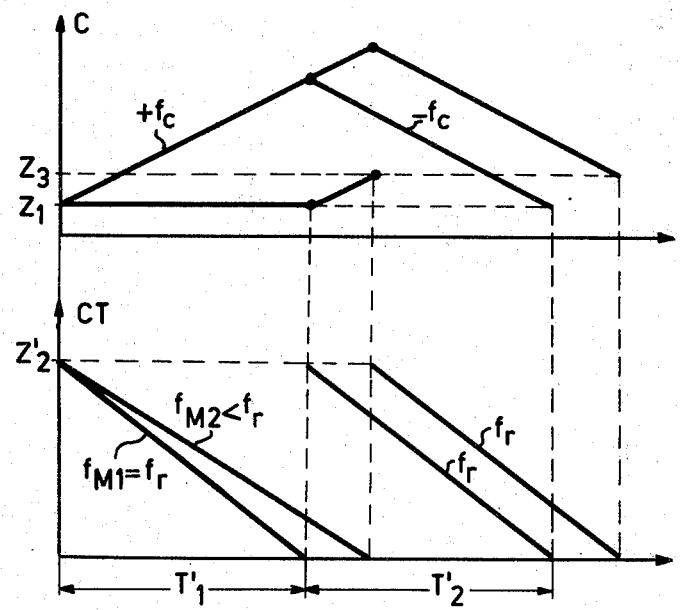
Figure 5:
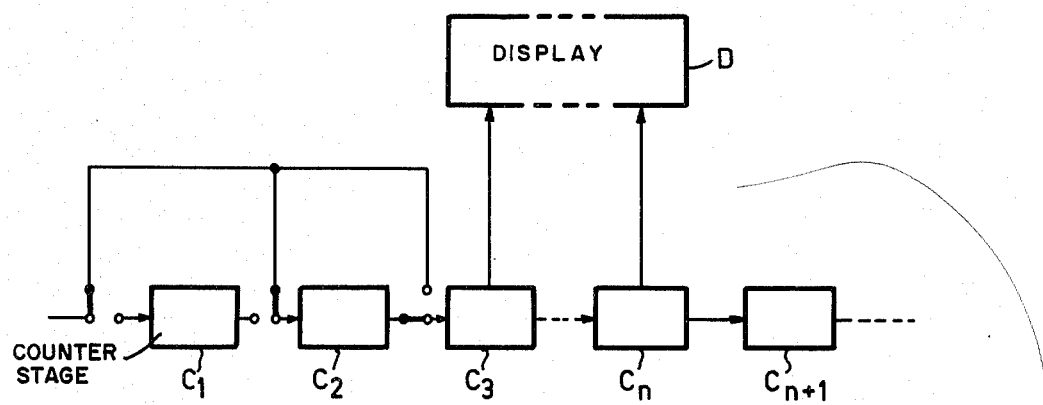
Figure 6:
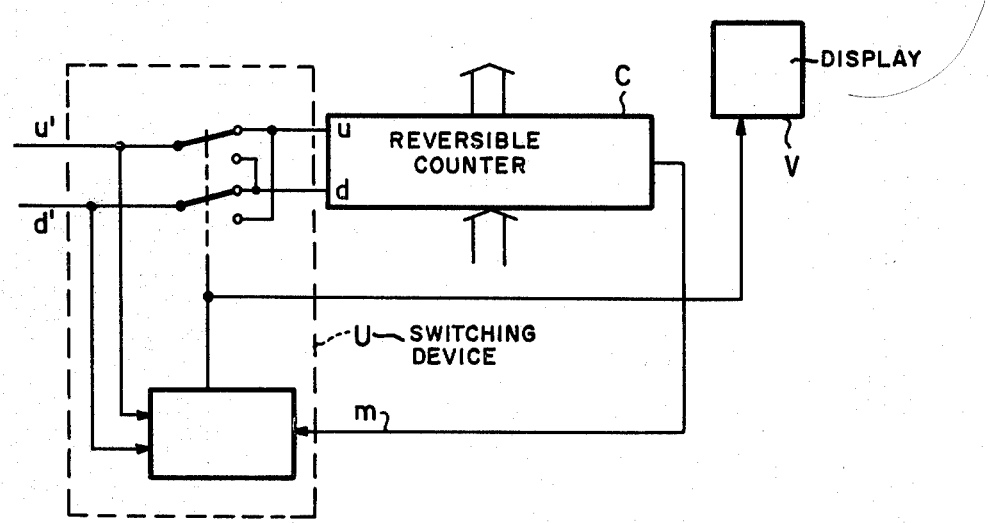

The invention will be described in more detail with reference to the accompanying drawing, in which:

FIG. 1 shows an apparatus for the readout of frequency-analog measuring signals, FIG. 2 is a diagram in explanation of the operation of the apparatus of FIG. 1, FIG. 3 shows an apparatus for the readout of period-analog measuring signals, FIG. 4 shows a diagram in explanation of the operation of the apparatus of FIG. 3, FIG. 5 shows a readout apparatus which is only connected to the intermediate stages of the counter, and FIG. 6 shows an embodiment for operation of the counter in the negative range.

The apparatus of FIG. 1 includes a counter C, which takes the form of a reversible counter and which has one input for each counting direction, viz. the input $u$ for counting up or forward and the input $d$ for counting down or backward. Each of said inputs is connected via a gate $G_u$ and $G_d$ respectively to the outputs of a synchronizing stage S which may be of the type described in U.S. Pat. No. 2,951,986. The measuring pulse train $f_M$ and a reference pulse train $f_r$ of constant frequency from the oscillator O are applied to the inputs of said synchronizing stage. Said input pulse trains are synchronized with a clock pulse train $f_c$ and, moreover, the difference between the two input pulse trains is formed with the aid of the clock pulses. This means that, for example, a pulse is obtained at the upper output of the synchronizing stage when the measuring pulse train $f_M$ contains one pulse more than the reference pulse train $f_r$. However, if the measuring pulse train $f_m$ contains one pulse less, a pulse is obtained at the lower output of the synchronizing stage S. Said difference formation in the synchronizing stage S is effective because mere synchronization of the two pulse trains necessitates practically the same steps, and said synchronization is necessary to ensure that in the case of the simultaneous occurrence of a pulse in the measuring pulse train $f_r$ and in the pulse train $f_1$ this does not result in the simultaneous appearance of a pulse at the two inputs of the counter C.

The lines to the two counting inputs $u$ and $d$ each include a gate $G_u$ and $G_d$ respectively, which gates are controlled by a control counter CT. Said control counter further controls a gate GD, via which the display unit D is connected to the outputs of the counter C, as well as a gate GZ, which transfers the binary-coded signals for the count $Z_1$ to the counter C and sets the counter to said count. Said signals and thus the count $Z_1$ are externally adjustable by means of switches. It is to be noted that the control lines for the individual gates are separate lines, which for simplicity are represented as a single line.

The control counter CT receives a clock pulse train $f_c$ of constant frequency at its counting input. Further, the control counter receives the similarly adjustable binary-coded signals for the count $Z_2$.

At the beginning of a measuring period, which may be initiated by a single signal or repetitively by a bistable multivibrator, the control counter CT is set to the preset count $Z_2$. A command signal then opens the gate GZ and the counter C is set to the count $Z_1$. Also, gates $G_u$ and $G_d$ are now set to open and gate GD is blocked. For the calibration of the apparatus the reference frequency $f_r$ must first be adjusted at the oscillator O. For this purpose a first physical quantity is applied to the measuring transducer, e.g. 10° C for a temperature transducer, so that said transducer will supply a measuring pulse train $f_{M1}$ with a corresponding frequency. The number $Z_1$ is adjusted to the value of said physical quantity, in the present case 10. The reference frequency $f_r$ is now equalized to the measuring frequency at this measuring value. This may, for example, be achieved by varying the frequency of the oscillator O until, at the end of the measuring time interval, when the gate GD opens and the contents of the counter C is displayed at the display unit D, it is ascertained that the count relative to the initial count, i.e. in the present case the zero point, has not changed. During the measuring period, the clock pulses ($f_c$) step the counter CT until it reaches zero, thus removing the command signal, whereupon gates $G_u$ and $G_d$ are blocked and gate GD opened, signifying the end of the measuring time interval. When the two frequencies of the input signals of the synchronizing circuit S are equal, the differential pulses will cancel each other until the end of the time interval. It will be obvious that for this calibration point the length of the time interval is arbitrary. The length of the time interval is determined by the number Z2 preset into control counter CT.

For adjusting the other reference point of the apparatus, a physical measuring quantity of different value, e.g. 100° C in the case of a temperature transducer, is applied to the measuring transducer, so that said transducer now supplies a measuring signal $f_{M2}$ of a higher frequency. Now, with the reference frequency held constant, the length of the time interval is adjusted so that at the end of the measuring period the contents of the counter C, which is displayed by the display unit D, is exactly $Z_3 = 100$. The signal which regulates the time interval is produced by the control counter CT, which counts down to zero at the constant clock frequency $f_c$ from the count $Z_2$, set into counter CT at the beginning of the measuring period. Thus, the length of the time interval can be readily adjusted by changing the number $Z_2$, which in its turn is set by means of externally actuated switches.

FIG. 2 illustrates the operation by means of a diagram. The left axis C represents the count of the counter C, which at the beginning of the measuring period is $Z_1$. When the measuring frequency $f_{M1}$ equals the reference frequency $f_r$, said count $Z_1$ will not change, as is indicated by the lower dashed line. At the measuring frequency $f_{M2}$ a difference frequency is obtained which corresponds to the slope of the upper dashed line. The time interval T is now adjusted so that the upper dashed line intersects the right-hand axis, which represents the counter indication at the end of the measuring period, exactly in $Z_3$, which corresponds to the value of the physical quantity. Any other arbitrary physical quantity which produces a measuring pulse train $f_M$ of corresponding frequency then yields a count Z which directly indicates the physical quantity.

FIG. 3 shows an apparatus for determining period-analog measuring values. The arrangement in the upper part of the apparatus is exactly the same as the apparatus of FIG. 1 and the same reference symbols are used. However, the synchronizing stage S receives only one input signal, viz. the clock pulse train $f_c$. The control counter CT' in principle produces the same signals as the control counter in FIG. 1. at the beginning of the measuring period the gate GZ is opened and the counter is set to the count $Z_1$. At the end of the measuring period the gate GD is opened and the contents of the counter C is displayed by the display unit D.

However, the two gates $G_u$ and $G_d$, which precede the counting inputs u and d, are not opened simultaneously, but one after another by correspondingly obtained time interval signals.

The control counter CT' now receives two different counting signals, viz. the measuring pulse train $f_M$ and the reference pulse train $f_r$. At the beginning of a measuring period the control counter is reset to the number $Z'_2$ and the control counter then counts down to zero with the measuring pulse train $f_M$, producing a gating signal which represents a first time interval $T'_1$ and which opens the gate $G_u$ during said time interval ($T_1'$) so that the counter counts up. When the control counter has reached its zero setting, it is at once automatically reset to $Z'_2$ (closing gate $G_u$) and subsequently it counts down to zero with the reference pulse train $f_r$, producing a gating signal which represents the second time interval $T'_2$ and which opens the gate $G_d$ during said second time interval ($T_2'$) and causes the counter C to count down. This is illustrated in the diagram of FIG. 4.

In said Figure it is first of all assumed that the measuring frequency $f_{M1}$ corresponds to the first value of the physical quantity, in the present example 10° C, and the reference frequency $f_r$ is adjusted to the same value at the oscillator O. The two time intervals $T'_1$ and $T'_2$ then have the same length and the counter C then counts during equal time intervals with the clock frequency $f_c$, first up (as denoted by the + sign) and then down (as indicated by the − sign), and thus reaches its initial positon $Z_1$ again.

When the second value of the physical quantity, 100° C in the present example, is applied to the apparatus and a measuring pulse train $f_{M2}$ with a longer period and thus a lower frequency is produced, the time interval $T'_1$ is prolonged, while the time interval $T'_2$ remains constant, so that the counter counts up for a longer time than it subsequently will count down, and thus retains a higher count at the end of the second time interval, i.e. at the end of the measuring period. Said count is determined by the difference between the two time intervals and said difference can be changed for certain given measuring frequencies by changing the number $Z'_2$, as will appear from FIG. 4. For calibration, the number $Z'_2$ for the measuring pulse train $f_{M2}$ is adjusted so that at the end of the measuring period the counter C has just reached position $Z_3$, which represents the second value of the physical quantity.

FIG. 4 also shows that the counter C must have a capacity which is greater than that which corresponds to the maximum measuring value. However, the display need only be capable of indicating the highest measuring value. It is consequently not necessary to make allowance for the highest stages of the counter C in the display unit. This is shown in FIG. 5, in which the display unit D is only connected to the counter stages $C_3$ to $C_n$, the stage $C_n$ containing the most significant digit of the maximum measuring value to be displayed. The digits of the subsequent counter stages $C_{n+1}$ etc. relate to the second time interval $T'_2$, in which the counter C counts down from the maximum count to the maximum measuring value. Said time interval depends on the number $Z'_2$, but is constant after calibration. FIG. 5 shows that the counter C is further preceded by two counter stages $C_1$ and $C_2$ whose inputs can be switched so as to shift the indication at the display unit D by one or two digits.

A possibility of reducing the capacity of the counter C and at the same time the measuring period in the case of period-analog measuring values, is to start the two time intervals $T'_1$ and $T'_2$ simultaneously. FIG. 4 shows that the count of the counter C at the end of the second time interval differs exactly as much from its initial count $Z_1$ as the difference between counts in the first time intervals $T'_1$ for measuring pulse trains relative to the measuring pulse train $f_{M1}$. The counter C therefore need not start counting until after the end of the time interval which expires first and stop at the end of the second time interval which has started simultaneously with the first time interval. Then, for the same initial count $Z_1$ of the counter C and the same count $Z'_2$ the same final count $Z_3$ will be obtained as is indicated by the lower line of the upper diagram in FIG. 4. However, in this case the control counter CT' should comprise two separate counters, of which one counter counts the measuring frequency $f_M$ and the other the reference frequency $f_r$ and which start simultaneously.

FIG. 4 further shows that in the case of a measuring frequency with a period which is shorter than that of the reference frequency and which is obtained for a measuring value which is smaller than the lower reference point, the time interval $T'_1$ will terminate before the time interval $T'_2$. In this case the counter C again starts counting upon termination of the time interval which expires first, in the present case the time interval $T'_1$, but now in the opposite direction, viz. down, because the measuring value, as stated, is now smaller. The counting direction of the counter C is determined by the corresponding gate $G_u$ or $G_d$, so that depending on which of the two time intervals expires first, only one of the gates is opened.

The systems described so far may also be employed to indicate negative measuring quantities with the correct sign. For this purpose, according to FIG. 6, a switching device U is included directly before the counting inputs u, d of the counter C, which device interchanges the signals u', d' for the two counting directions. In the case of a negative measuring value the counter C first counts down, until it has reached zero. This results in a control signal m, which actuates the switching device U, so that pulses which subsequently arrive at the count-down input d' are applied to the count-up input u of the counter. Simultaneously, said switching signal also activates the minus sign on the display V before the indication. The switching signal not only allows for the control signal caused by the counter C passing through zero but also for the counting pulses for two counting directions. When the counter C reaches zero from positive values and subsequently a pulse appears at the line u' for the forward direction, change-over should not yet occur. The control signal m may also be produced by an externally actuated switch, when, for some reason, the counting direction is to be reversed. This is necessary when the first physical quantity at which the reference frequency $f_r$ is adjusted has a negative value of, for example, $-10°$ C, the counter again being set to 10 but device the sign being set to minus via the switching devie U. When subsequently a positive value is measured, the counter C first counts down to zero, which results in a control signal m, so that the switching device U is reset to the normal state. The counter C then counts up again and the further sequence is as described previously.

What is claimed is:

1. An apparatus for the digital readout of a physical measuring quantity represented by the frequency of a measuring pulse train comprising, a reversible counter having up and down counting input terminals, means coupled to the counter to preset it to a first count which represents a first given measuring value, means for applying a measuring pulse train whose frequency is proportional to said physical measuring quantity to the counting input terminal for one counting direction during a first time interval of adjustable length, means for applying a reference pulse train to the opposite counting input terminal of the counter during a second, equally long time interval, means for equalizing the frequency of the reference pulse train to that of the measuring pulse train which represents the first given measuring value, and means for adjusting the duration of the time intervals so that upon application of a second measuring pulse train which represents another given physical measuring value the contents of the counter at the end of the measuring period which terminates together with the last time interval represents the other measuring value, whereby the count in said counter at the end of a measuring period provides a direct readout of the value of the measuring quantity.

2. An apparatus as claimed in claim 1, characterized in that the two time intervals coincide and further comprising means for combining the measuring and reference pulse train so that during the time intervals the counter simultaneously receives the pulses of the measuring pulse train and the reference pulse train at the counting inputs for the corresponding counting directions and thus counts the difference between the two pulse trains.

3. An apparatus as claimed in claim 1 further comprising a synchronizing stage which precedes the up and down counting inputs of the counter means for applying the measuring and reference pulse trains to the synchronzing stage which stage forms pulses which correspond to the difference between the measuring pulse train and the reference pulse train and supplies said pulses to the counting input which corresponds to the sign of the difference.

4. An apparatus as claimed in claim 1 further comprising, a source of clock pulses, a control counter responsive to the clock pulses for counting an adjustable number ($Z_2$) of clock pulses and during said time produces a control signal which represents the time interval the duration of said control signal being adjustable by adjustment of the number ($Z_2$).

5. An apparatus for the digital readout of a physical measuring quantity represented by the period of a measuring pulse train comprising, a reversible counter having up and down counting input terminals, means coupled to the counter to preset it to a first count which represents a first given measuring value, means for applying a clock pulse train of fixed frequency to the counting input terminal for one counting direction during a first time interval whose length is determined by an adjustable number of measuring pulses, means for applying the clock pulse train to the opposite counting input terminal during a second time interval whose length is determined by an equal number of reference pulses, means for equalizing the frequency of the reference pulse train to that of the measuring pulse train which represents the first given measuring value, and means for adjusting the number which determines the length of the time intervals so that upon application of a measuring pulse train which represents another given measuring value the contents of the counter at the end of the measuring period which terminates together with the last time interval represents the other measuring value, whereby the count in the counter at the end of a measuring period provides a direct readout of the value of the measuring quantity.

6. An apparatus as claimed in claim 5 further comprising a control counter responsive to the measuring pulse train for counting the adjustable number of measuring pulses and during said time produces a first control signal which represents the first time interval is responsive to the reference pulse train for counting and subsequentially an equal number of reference pulses and during said time produces a second control signal which represents the second time interval.

7. An apparatus as claimed in claim 6, wherein only the lower counter stages of the counter which correspond to the given measuring range are connected to a display device.

8. An apparatus as claimed in claim 5, characterized in that the two time intervals begin simultaneously and that not until after the end of the time interval which terminates first the clock pulse train is applied to the counting input of the counter for that counting direction which is determined by the time interval which terminates first.

9. An apparatus as claimed in claim 8, characterized in that two control counters are provided which start simultaneously one of which counts the measuring pulse train and the other the reference pulse train and that each individually counting control counter produces a differential time interval for the counting input of the corresponding counting direction of the counter.

10. An apparatus as claimed in claim 1 further comprising a switching device coupled to said counter up and down counting input terminals and means for deriving a control signal whereby the signals for the two counting directions are interchanged by said switching device under control of said control signal deriving means.

11. An apparatus as claimed in claim 10, wherein the control signal is produced by the counter (C) passing through zero.

12. A method of calibrating a digital display system of the type including a reversible counter and a control counter comprising the steps of generating first and second trains of measuring pulses determined respectively by first and second physical measuring quantities, generating a train of reference pulses, presetting the reversible counter to a first count related to said first physical measuring quantity, presetting the control counter to a first given count, applying said first train of measuring pulses and said train of reference pulses to one of said counters while applying a train of clock pulses to the other counter and adjusting the frequency of said train of reference pulses to equal the frequency of said first train of measuring pulses, applying said second train of measuring pulses and the adjusted train of reference pulses to said one counter while applying a train of clock pulses to the other counter and adjusting the preset count in the control counter to a second given count related to the second physical measuring quantity.

13. Apparatus for measuring the frequency of a source of measuring pulses comprising, a reversible counter having up and down input counting terminals, an adjustable source of reference pulses, wherein said adjustable source of reference pulses is adjusted to equalize the reference pulses to measuring pulses representative of a reference quantity thereby to calibrate the apparatus prior to a measuring operation, a synchronizing unit having input means coupled to receive said measuring pulses and said reference pulses and adapted to produce at its output means counting pulses equal to the difference between the two input pulse trains, pulse gate means coupled between the synchronizing unit output means and the up and down counting terminals of the reversible counter for selectively applying the counting pulses to the up and down counting terminals, gating means for presetting a first given count in the reversible counter at the start of a measuring period, and adjustable control means for generating a gate control signal that determines the length of a measuring period, wherein said adjustable control means comprises a control counter with means for presetting an adjustable count therein, a source of clock pulses coupled to said synchronizing unit and said control counter, the time period of the gate control signal being determined by the count preset into the control counter, said control means controlling said pulse gate means and said gating means to hold open said pulse gate means during a measuring period.

* * * * *

UNITED STATES PATENT AND TRADEMARK OFFICE
CERTIFICATE OF CORRECTION

PATENT NO. : 4,004,137
DATED : January 18, 1977
INVENTOR(S) : GERD SCHRODER

It is certified that error appears in the above-identified patent and that said Letters Patent are hereby corrected as shown below:

Col. 1, line 14, after "problems" the ";" (semicolon) should be cancelled line 22, after "possible" the ";" (semicolon) should be cancelled Col. 4, line 5, "$f_r$" should be --$f_m$--;

line 6, "$f_1$" should be --$f_r$--;

Col. 5, line 30, "at" should be --At--;

Col. 7, line 26, "device" should be --moreover--;

line 27, "devie" should be --device--.

UNITED STATES PATENT AND TRADEMARK OFFICE
CERTIFICATE OF CORRECTION

PATENT NO. : 4,004,137
DATED : January 18, 1977
INVENTOR(S) : GERD SCHRODER

It is certified that error appears in the above—identified patent and that said Letters Patent are hereby corrected as shown below:

Claim 6, line 5, before "is" should be inserted --and subsequentially--;

lines 6-7, "and subsequentially" should be deleted

Claim 11, line 2, "(C)" should be deleted.

Signed and Sealed this

Sixth Day of December 1977

[SEAL]

Attest:

RUTH C. MASON
Attesting Officer

LUTRELLE F. PARKER
Acting Commissioner of Patents and Trademarks